United States Patent
Cripe

(10) Patent No.: US 10,153,421 B1
(45) Date of Patent: Dec. 11, 2018

(54) PIEZOELECTRIC TRANSISTORS WITH INTRINSIC ANTI-PARALLEL DIODES

(71) Applicant: Rockwell Collins, Inc., Cedar Rapids, IA (US)

(72) Inventor: David W. Cripe, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 359 days.

(21) Appl. No.: 15/019,367

(22) Filed: Feb. 9, 2016

(51) Int. Cl.
| | |
|---|---|
| *H01L 41/08* | (2006.01) |
| *H01L 41/09* | (2006.01) |
| *H01L 41/047* | (2006.01) |
| *H01L 41/107* | (2006.01) |
| *H02M 7/04* | (2006.01) |

(52) U.S. Cl.
CPC ............ *H01L 41/09* (2013.01); *H01L 41/047* (2013.01); *H01L 41/107* (2013.01); *H02M 7/04* (2013.01)

(58) Field of Classification Search
CPC ..... H01L 41/09; H01L 41/047; H01L 41/107; H02M 7/04
See application file for complete search history.

(56) References Cited

U.S. PATENT DOCUMENTS

| | | | |
|---|---|---|---|
| 8,159,854 B2 | 4/2012 | Elmegreen et al. | |
| 9,251,884 B2 * | 2/2016 | Elmegreen | G11C 11/22 |
| 9,425,381 B2 * | 8/2016 | Elmegreen | H01L 41/083 |
| 9,461,236 B1 * | 10/2016 | Cripe | H01L 41/107 |
| 2010/0328984 A1 * | 12/2010 | Elmegreen | G11C 11/412 365/72 |
| 2011/0133603 A1 * | 6/2011 | Elmegreen | H01L 49/00 310/328 |
| 2013/0009668 A1 * | 1/2013 | Elmegreen | H01L 49/00 326/102 |
| 2014/0169078 A1 * | 6/2014 | Elmegreen | G11C 11/22 365/157 |
| 2017/0090638 A1 * | 3/2017 | Vosgueritchian | G06F 3/0414 |

* cited by examiner

*Primary Examiner* — J. San Martin
(74) *Attorney, Agent, or Firm* — Angel N. Gerdzhikov; Donna P. Suchy; Daniel M. Barbieri

(57) ABSTRACT

Piezoelectric transistors with Schottky contacts and power conversion applications utilizing such piezoelectric transistors are disclosed. A piezoelectric transistor configured in accordance with the inventive concepts disclosed herein may be fabricated to behave as a controllable/switchable active device with an intrinsic anti-parallel diode. Piezoelectric transistors configured in this manner may be utilized in power amplifiers, power converters, as well as in a variety of electronic systems/applications.

20 Claims, 3 Drawing Sheets

PIEZOELECTRIC TRANSISTORS WITH INTRINSIC ANTI-PARALLEL DIODES

BACKGROUND

It is recognized within the electrical engineering community that power conversion of direct current (DC) to radio frequency (RF) power can be efficiently performed using active devices having dynamic characteristics that closely mimic that of switches. It is noted, however, that conventional switches dissipate power, which is an undesirable behavior.

A piezoelectric transistor is a new type of active electronic device, fabricated by mechanically coupling a piezoelectric actuator to a piezoresistive element. Since the actuation of a piezoelectric transistor is not defined by semiconductor band gap potential, a piezoelectric transistor may be operable at voltages much lower than that of conventional switches to help mitigate power dissipation.

However, piezoelectric transistors may not be readily suitable for power conversion applications (e.g., utilized in switching power amplifiers or other devices) because piezoelectric transistors do not possess intrinsic anti-parallel diodes that are beneficial in power conversion applications. Anti-parallel diodes are beneficial because if the load impedance of a power amplifier is non-ideal, and there are out-of-phase current, the presence of an anti-parallel diode may allow reverse current flow through the power amplifier without damaging reverse bias of the drain-source potential, permitting voltage clamping of the drain terminal and effectively serving as a self-protection mechanism.

SUMMARY

In one aspect, embodiments of the inventive concepts disclosed herein are directed to an apparatus. The apparatus may include a piezoelectric actuator positioned between a first electrode and a second electrode. The piezoelectric actuator may be configured to expand or contract in response to an electric potential. The apparatus may also include a piezoresistive switching element positioned between a third electrode and a fourth electrode. One of the third electrode or the fourth electrode may include a Schottky contact, and the piezoresistive switching element may be configured to change an electrical resistance of the piezoresistive switching element in response to a stress applied to the piezoresistive switching element due to expansion or contraction of the piezoelectric actuator.

In a further aspect, embodiments of the inventive concepts disclosed herein are directed to an apparatus. The apparatus may include a piezoelectric actuator positioned between a first electrode and a second electrode. The piezoelectric actuator may be configured to expand or contract in response to an electric potential. The apparatus may also include a piezoresistive switching element positioned between the second electrode and a third electrode. One of the second electrode or the third electrode may include a Schottky contact, and the piezoresistive switching element may be configured to change an electrical resistance of the piezoresistive switching element in response to a stress applied to the piezoresistive switching element due to expansion or contraction of the piezoelectric actuator.

In another aspect, embodiments of the inventive concepts disclosed herein are directed to an apparatus. The apparatus may include a piezoelectric actuator positioned between a first electrode and a second electrode. The piezoelectric actuator may be configured to expand or contract in response to an electric potential. The apparatus may also include a piezoresistive switching element positioned between a third electrode and a fourth electrode. The piezoresistive switching element may be configured to change an electrical resistance of the piezoresistive switching element in response to a stress applied to the piezoresistive switching element due to expansion or contraction of the piezoelectric actuator, and one of the third electrode or the fourth electrode may include a Schottky contact. The apparatus may further include a dielectric layer positioned between the piezoelectric actuator and the piezoresistive switching element. The dielectric layer may be configured to electrically separate the piezoelectric actuator from the piezoresistive switching element.

It is to be understood that both the foregoing general description and the following detailed description are exemplary and explanatory only and are not restrictive of the inventive concepts disclosed and claimed herein. The accompanying drawings, which are incorporated in and constitute a part of the specification, illustrate embodiments of the inventive concepts and together with the general description, serve to explain the principles and features of the inventive concepts disclosed herein.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Figure 1:
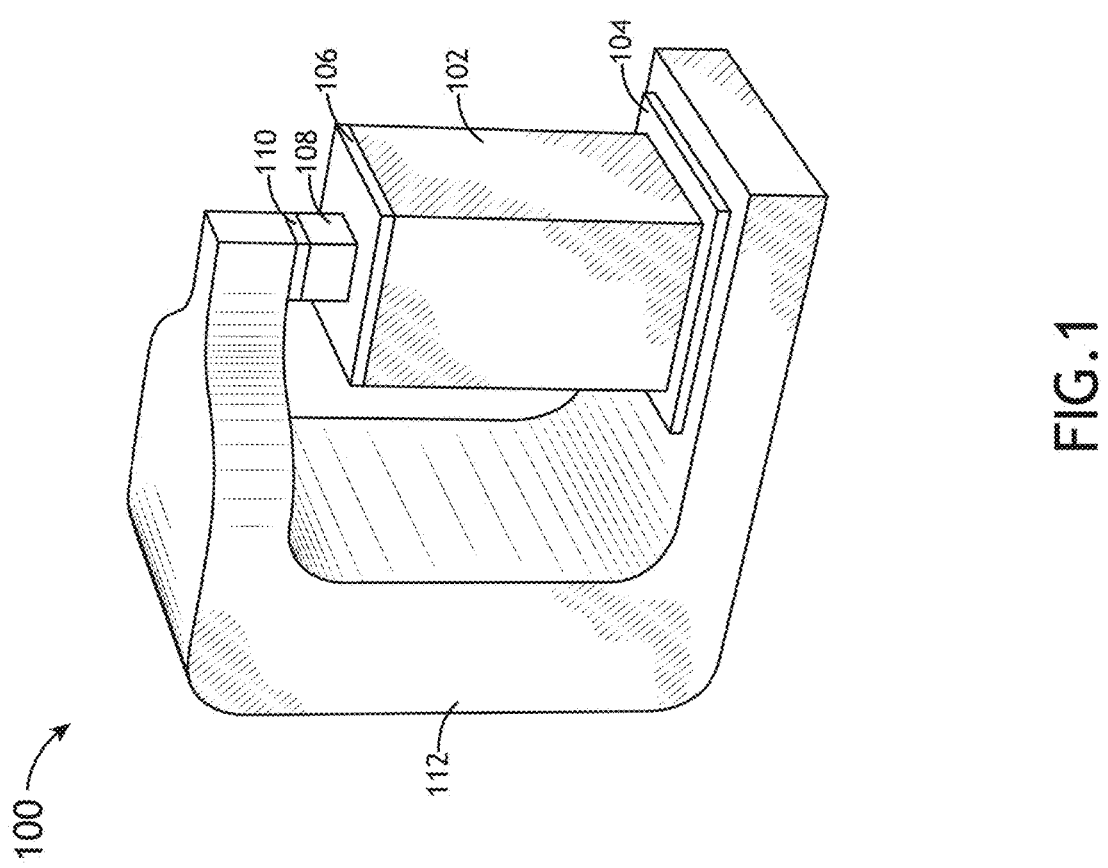
FIG. 1 is an isometric view of an exemplary piezoelectric transistor according to an exemplary embodiment of the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Reference will now be made in detail to exemplary embodiments of the inventive concepts disclosed herein, examples of which are illustrated in the accompanying drawings.

Embodiments in accordance with the inventive concepts disclosed herein are directed to piezoelectric transistors with Schottky contacts and power conversion applications utilizing such piezoelectric transistors. A piezoelectric transistor configured in accordance with the inventive concepts disclosed herein may be fabricated to behave as a controllable/switchable active device with an intrinsic anti-parallel diode. It is noted that piezoelectric transistors configured in this manner may be utilized in a variety of electronic systems/applications, including (but not limited to) power amplifiers, power converters and the like.

Referring generally to FIG. 1, an isometric view of an exemplary piezoelectric transistor 100 configured in accordance with an embodiment of the inventive concepts disclosed herein is shown. The piezoelectric transistor 100 includes a piezoelectric actuator 102 positioned between a first electrode 104 and a second electrode 106. The piezoelectric transistor 100 may also include a piezoresistive switching element 108 positioned between the second electrode 106, and a third electrode 110. The piezoelectric actuator 102 may include materials such as lead zirconium titanate (may also be referred to as PZT) or sodium potassium niobate or the like, which may expand or contract in response to an electric potential (e.g., a control voltage) applied to the piezoelectric actuator 102. The piezoresistive switching element 108, on the other hand, may include materials such as the rare-earth monochalcogenides (e.g., samarium monochalcogenides) or the like, which may change its electrical resistance and transition between a conductive state and a nonconductive state (e.g., switched on or off) in response to a mechanical stress applied to the piezoresistive switching element 108.

Because the piezoelectric actuator 102 and the piezoresistive switching element 108 are restricted by a frame 112 (may also be referred to as a clamp), mechanical stress may be applied to the piezoresistive switching element 108 due to expansion of the piezoelectric actuator 102. Since the conductivity of the piezoresistive switching element 108 is sensitive to the mechanical stress applied to the piezoresistive switching element 108, its conductivity can be controlled by controlling the expansion or contraction of the piezoelectric actuator 102, allowing the piezoelectric transistor 100 to function as a controllable active device.

In some embodiments, one of the electrodes in contact with the piezoresistive switching element 108 (e.g., the second electrode 106) may be implemented as an ohmic contact and the other electrode (e.g., the third electrode 110) may be implemented as a Schottky contact. It is to be understood that an ohmic contact may be implemented utilizing any electrical junction or contact that has a linear current-voltage (I-V) curve. A Schottky contact (may also be referred to as a Schottky barrier), on the other hand, refers to a junction or contact that does not demonstrate a linear I-V curve. It is noted that positioning the piezoresistive switching element 108 between an ohmic contact 106 and a Schottky contact 110 may allow the Schottky contact 110 to function as a potential energy barrier, which has rectifying characteristics and is suitable for use as a diode. In other words, positioning the piezoresistive switching element 108 between an ohmic contact 106 and a Schottky contact 110 may allow the piezoelectric transistor 100 to behave as a controllable active device with an intrinsic anti-parallel diode.

Figure 2:
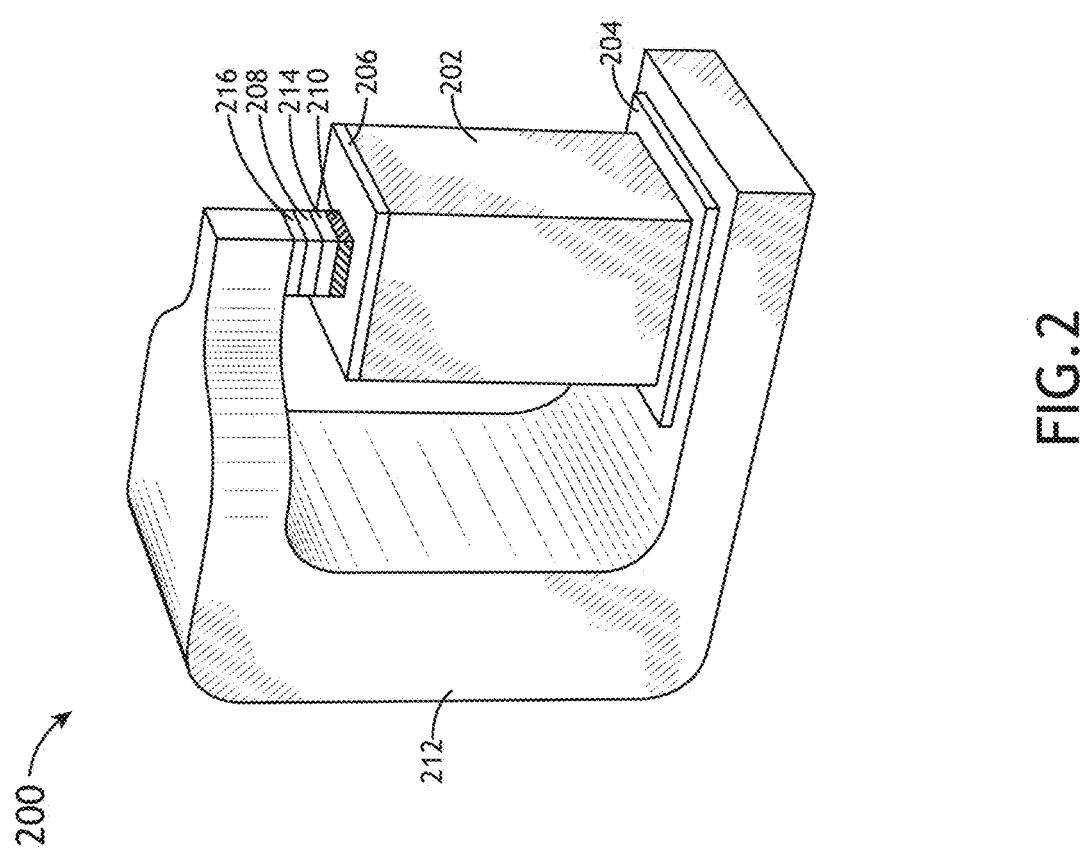
FIG. 2 is an isometric view of another exemplary piezoelectric transistor according to an exemplary embodiment of the inventive concepts disclosed herein.

Referring now to FIG. 2, an isometric view of another exemplary piezoelectric transistor 200 configured in accordance with an embodiment of the inventive concepts disclosed herein is shown. Similar to the piezoelectric transistor 100 described above, the piezoelectric transistor 200 may include a piezoelectric actuator 202 and a piezoresistive switching element 208 restricted by a frame 212. The piezoelectric actuator 202 may be positioned between a first electrode 204 and a second electrode 206, and the piezoresistive switching element 208 may transition between a conductive state and a nonconductive state in response to mechanical stress applied to the piezoresistive switching element 208 as the piezoelectric actuator 202 expands/contracts.

The piezoelectric transistor 200 may also include a dielectric layer 210 positioned between the piezoelectric actuator 202 and the piezoresistive switching element 208 to electrically separate the piezoelectric actuator 202 from the piezoresistive switching element 208. The piezoresistive switching element 208 configured in this manner may not need to be connected to the second electrode 206. Instead, the piezoresistive switching element 208 configured in this manner may be positioned between a third electrode 214 and a fourth electrode 216, effectively providing a four-terminal controllable active device.

It is contemplated that either the third electrode 214 or the fourth electrode 216 may be implemented as a Schottky contact. Likewise, the polarity of the piezoelectric actuator 202 may be installed in either direction. It is to be understood that specific implementations of the piezoelectric transistor 200 may vary without departing from the broad scope of the inventive concepts disclosed herein, as long as the piezoelectric transistor 200 is configured in a manner that application of a voltage across the piezoelectric actuator 202 can result in change of conductive state of the piezoresistive switching element 208.

Figure 3:
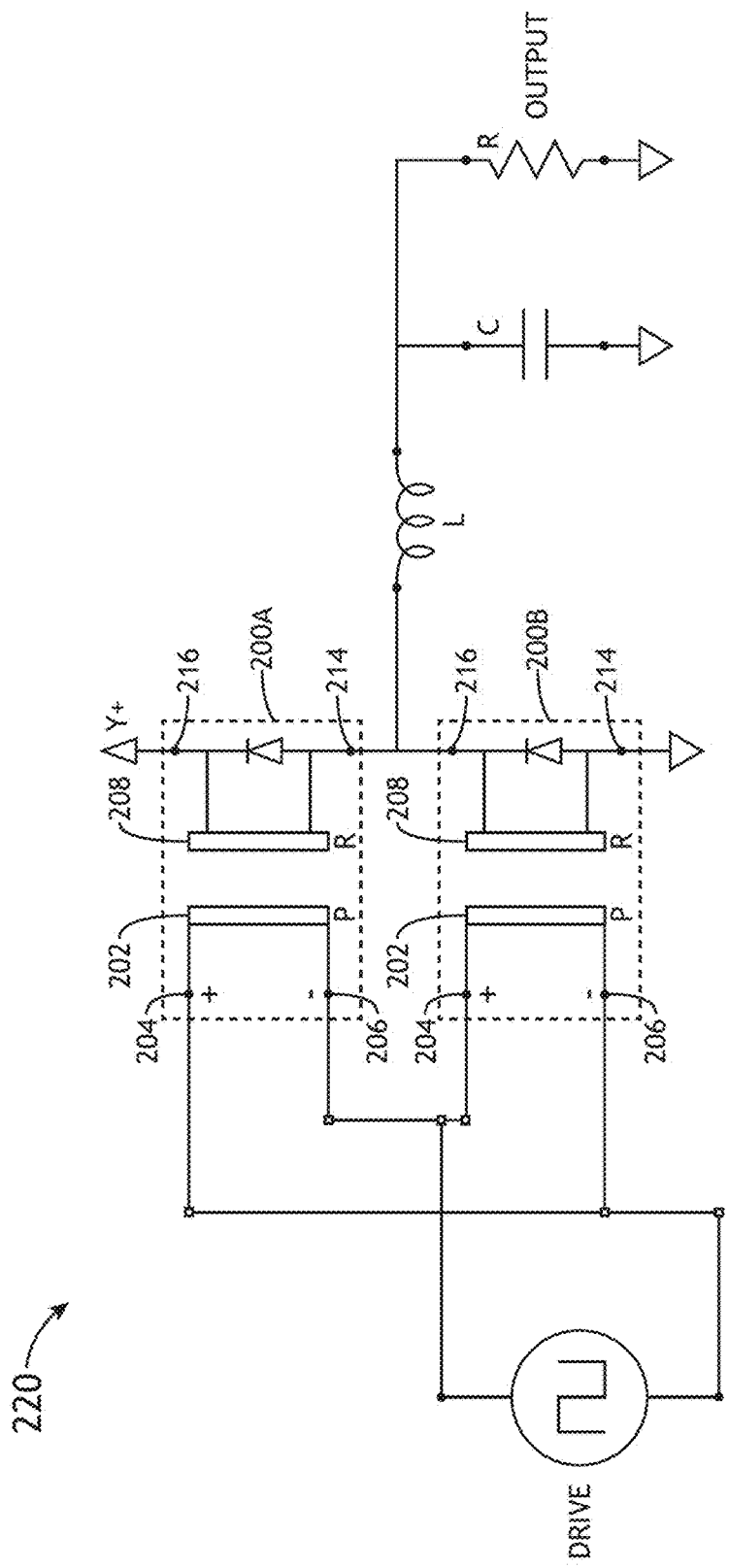
FIG. 3 is a schematic of a half-bridge circuit according to an exemplary embodiment of the inventive concepts disclosed herein.

FIG. 3 is a schematic showing two piezoelectric transistors 200A and 200B configured in an exemplary half-bridge circuit 220 for power conversion. For purposes of presentation simplicity, symbols 200A and 200B are used in the schematic to depict piezoelectric transistors 200 described above. It is noted that the reference numerals used in the symbols 200A and 200B are kept consistent with that used in FIG. 2. For example, reference numerals 202 and 208 are continually used in FIG. 3 to reference the piezoelectric actuator 202 and the piezoresistive switching element 208 depicted in FIG. 2, respectively.

As shown in FIG. 3, the piezoelectric transistors 200A and 200B configured in the half-bridge circuit 220 may be driven to conduction in a complementary sequence. The isolated inputs to the piezoelectric transistors 200A and 200B may permit a single, common drive signal to actuate both piezoelectric transistors 200A and 200B. The intrinsic Schottky diodes formed in the piezoelectric transistors 200A and 200B may permit one of the piezoelectric transistors (e.g., the piezoelectric transistor 200B) in the half-bridge circuit 220 to behave as a synchronous rectifier, which is appreciated in a power conversion application.

It is to be understood that while the half-bridge circuit 220 depicted in FIG. 3 utilizes four-terminal piezoelectric transistors 200A and 200B, utilization of such devices are merely exemplary and are not meant to be limiting. If the dielectric layer 210 is omitted from the fabrication of the piezoelectric transistor, one of the terminals (referred to as electrodes 204 and 206) of the piezoelectric actuator 202 may be electrically connected to one of the terminals (referred to as electrodes 214 or 216) of the piezoresistive switching element 208, effectively creating a three-terminal controllable active device (similar to the piezoelectric transistor 100 depicted in FIG. 1) that can be used in manners similar to that of N-channel and/or P-channel metal-oxide-semiconductor field-effect transistor (MOSFET) devices.

It is contemplated that the piezoelectric transistors 100 and 200 disclosed herein may be utilized in a variety of electronic systems/applications in addition to half-bridge circuits. It is to be understood that the half-bridge circuit 220 is presented merely as an example. It is contemplated that circuits designed for other purposes may utilize the piezoelectric transistors 100 and 200 without departing from the broad scope of the inventive concepts disclosed herein.

As will be appreciated from the above, piezoelectric transistors configured in accordance with the inventive concepts disclosed herein are not only operable at low voltages, but may also be fabricated to behave as controllable active devices with intrinsic anti-parallel diodes. Piezoelectric transistors configured in this manner may be suitable for a variety of electronic systems/applications, including power amplification and/or conversion applications. Furthermore, piezoelectric transistors with Schottky contacts may have very fast recovery time, which may be appreciated in various operating conditions.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

It is believed that the inventive concepts disclosed herein and many of their attendant advantages will be understood by the foregoing description, and it will be apparent that various changes may be made in the form, construction, and arrangement of the components thereof without departing from the broad scope of the inventive concepts or without sacrificing all of their material advantages. The form herein before described being merely an explanatory embodiment thereof, it is the intention of the following claims to encompass and include such changes.

What is claimed is:

1. An apparatus, comprising:
a piezoelectric actuator positioned between a first electrode and a second electrode, the piezoelectric actuator configured to expand or contract in response to an electric potential, the piezoelectric actuator including lead zirconium titanate or sodium potassium niobate; and
a piezoresistive switching element positioned between a third electrode and a fourth electrode, the piezoresistive switching element configured to change an electrical resistance of the piezoresistive switching element in response to a stress applied to the piezoresistive switching element due to expansion or contraction of the piezoelectric actuator, the piezoresistive switching element including rare-earth monochalcogenides,
wherein at least one of the third electrode and the fourth electrode comprises a Schottky contact, the Schottky contact including a non-linear I-V curve.

2. The apparatus of claim 1, wherein one of the third electrode and the fourth electrode comprises a Schottky contact and the other one of the third electrode and the fourth electrode comprises an ohmic contact.

3. The apparatus of claim 1, wherein one of the first electrode and the second electrode is electrically connected to one of the third electrode and the fourth electrode.

4. The apparatus of claim 1, wherein one of the first electrode and the second electrode is one of the third electrode and the fourth electrode.

5. The apparatus of claim 1, further comprising:
a dielectric layer positioned between the piezoelectric actuator and the piezoresistive switching element.

6. The apparatus of claim 5, wherein the dielectric layer electrically separates the piezoelectric actuator from the piezoresistive switching element.

7. The apparatus of claim 1, wherein the piezoelectric actuator and the piezoresistive switching element are restricted within a frame.

8. The apparatus of claim 1, wherein the piezoelectric actuator and the piezoresistive switching element jointly form a controllable active device.

9. The apparatus of claim 8, wherein the controllable active device is utilized in a power converter.

10. An apparatus, comprising:
a piezoelectric actuator positioned between a first electrode and a second electrode, the piezoelectric actuator configured to expand or contract in response to an electric potential, the piezoelectric actuator including lead zirconium titanate or sodium potassium niobate; and
a piezoresistive switching element positioned between the second electrode and a third electrode, the piezoresistive switching element configured to change an electrical resistance of the piezoresistive switching element in response to a stress applied to the piezoresistive switching element due to expansion or contraction of the piezoelectric actuator, the piezoresistive switching element including rare-earth monochalcogenides, wherein at least one of the second electrode and the third electrode comprises a Schottky contact, the Schottky contact including a non-linear I-V curve.

11. The apparatus of claim 10, wherein one of the second electrode and the third electrode comprises a Schottky contact and the other one of the second electrode and the third electrode comprises an ohmic contact.

12. The apparatus of claim 10, wherein the piezoelectric actuator and the piezoresistive switching element are restricted within a frame.

13. The apparatus of claim 10, wherein the piezoelectric actuator and the piezoresistive switching element jointly form a controllable active device.

14. The apparatus of claim 13, wherein the controllable active device is utilized in a power converter.

15. An apparatus, comprising:
a piezoelectric actuator positioned between a first electrode and a second electrode, the piezoelectric actuator configured to expand or contract in response to an electric potential, the piezoelectric actuator including lead zirconium titanate or sodium potassium niobate;
a piezoresistive switching element positioned between a third electrode and a fourth electrode, the piezoresistive switching element configured to change an electrical resistance of the piezoresistive switching element in response to a stress applied to the piezoresistive switching element due to expansion or contraction of the piezoelectric actuator, the piezoresistive switching element including rare-earth monochalcogenides, and at least one of the third electrode and the fourth electrode comprises a Schottky contact, the Schottky contact including a non-linear I-V curve; and
a dielectric layer positioned between the piezoelectric actuator and the piezoresistive switching element, the dielectric layer configured to electrically separate the piezoelectric actuator from the piezoresistive switching element.

16. The apparatus of claim 15, wherein one of the third electrode and the fourth electrode comprises a Schottky contact and the other one of the third electrode and the fourth electrode comprises an ohmic contact.

17. The apparatus of claim 15, wherein the piezoelectric actuator and the piezoresistive switching element are restricted within a frame.

18. The apparatus of claim 15, wherein the piezoelectric actuator and the piezoresistive switching element jointly form a controllable active device.

19. The apparatus of claim 18, wherein the controllable active device is utilized in a power converter.

20. The apparatus of claim 19, wherein the controllable active device forms a part of a half-bridge circuit utilized in the power converter.

* * * * *